(12) United States Patent
Liu et al.

(10) Patent No.: US 10,347,119 B2
(45) Date of Patent: Jul. 9, 2019

(54) GIMBAL REMOTE CONTROLLER AND HANDHELD GIMBAL USING THE GIMBAL REMOTE CONTROLLER

(71) Applicant: SZ DJI OSMO TECHNOLOGY CO., LTD., Shenzhen (CN)

(72) Inventors: Hao Liu, Shenzhen (CN); Paul Pan, Shenzhen (CN)

(73) Assignee: SZ DJI OSMO TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/642,845

(22) Filed: Jul. 6, 2017

(65) Prior Publication Data
US 2017/0301230 A1 Oct. 19, 2017

Related U.S. Application Data

(63) Continuation of application No. PCT/CN2015/070212, filed on Jan. 6, 2015.

(51) Int. Cl.
| | |
|---|---|
| G08C 17/02 | (2006.01) |
| G03B 17/56 | (2006.01) |
| H01R 24/60 | (2011.01) |
| H01R 13/52 | (2006.01) |
| H05K 5/00 | (2006.01) |
| H05K 5/03 | (2006.01) |
| H05K 5/02 | (2006.01) |
| H01R 24/64 | (2011.01) |

(52) U.S. Cl.
CPC ........... *G08C 17/02* (2013.01); *G03B 17/561* (2013.01); *G03B 17/563* (2013.01); *H05K 5/0004* (2013.01); *H05K 5/0017* (2013.01); *H05K 5/0247* (2013.01); *H05K 5/03* (2013.01); *H01R 13/5213* (2013.01); *H01R 24/60* (2013.01); *H01R 24/64* (2013.01)

(58) Field of Classification Search
CPC ..................................................... G08C 17/02
USPC ...................................................... 340/12.55
See application file for complete search history.

(56) References Cited

U.S. PATENT DOCUMENTS

| | | | | |
|---|---|---|---|---|
| 2004/0223081 | A1* | 11/2004 | Gale | F16M 13/04 348/376 |
| 2004/0223753 | A1* | 11/2004 | Gale | F16M 13/04 396/421 |
| 2006/0268156 | A1* | 11/2006 | Gale | H04N 5/2251 348/373 |

(Continued)

FOREIGN PATENT DOCUMENTS

| | | |
|---|---|---|
| CN | 101291396 A | 10/2008 |
| CN | 102364544 A | 2/2012 |

(Continued)

OTHER PUBLICATIONS

The World Intellectual Property Organization (WIPO) International Search Report and Written Opinion for PCT/CN2015/070212 dated Oct. 10, 2015 8 Pages.

*Primary Examiner* — Santiago Garcia
(74) *Attorney, Agent, or Firm* — Anova Law Group, PLLC

(57) ABSTRACT

A gimbal remote controller includes a press key, a sensor disposed below the press key for acquiring an operation state of the press key, and a controller electrically coupled to the sensor and configured to send a gimbal control signal in accordance with the operation state of the press key.

18 Claims, 6 Drawing Sheets

(56) References Cited

U.S. PATENT DOCUMENTS

| | | | |
|---|---|---|---|
| 2006/0287085 A1* | 12/2006 | Mao | A63F 13/06 463/37 |
| 2007/0050139 A1 | 3/2007 | Sidman et al. | |
| 2010/0282844 A1* | 11/2010 | Talir | G06F 3/016 235/404 |
| 2014/0205276 A1* | 7/2014 | Johnston | G03B 17/561 396/421 |
| 2014/0267805 A1* | 9/2014 | Webb | H04N 5/2328 348/208.2 |
| 2014/0288694 A1* | 9/2014 | Wagner | F16M 11/18 700/213 |
| 2015/0015607 A1* | 1/2015 | Sodhi | G06F 3/016 345/633 |
| 2016/0171330 A1* | 6/2016 | Mentese | G06K 9/3233 348/170 |
| 2016/0201847 A1* | 7/2016 | Firchau | F16M 11/041 224/567 |
| 2016/0252799 A1* | 9/2016 | Li | F16M 11/28 396/425 |
| 2016/0337492 A1* | 11/2016 | Tseng | H04M 1/0264 |
| 2017/0227162 A1* | 8/2017 | Saika | F16M 13/02 |
| 2017/0302852 A1* | 10/2017 | Lam | H04N 5/23287 |

FOREIGN PATENT DOCUMENTS

| | | |
|---|---|---|
| CN | 202907117 U | 4/2013 |
| CN | 202937974 U | 5/2013 |
| CN | 104019348 A | 9/2014 |
| CN | 203838864 U | 9/2014 |
| CN | 204360224 U | 5/2015 |
| JP | 2003259180 A | 9/2003 |
| JP | 3098810 U | 3/2004 |
| JP | 2005150921 A | 6/2005 |
| JP | 3128726 U | 1/2007 |
| JP | 2010244585 A | 10/2010 |
| JP | 2013080325 A | 5/2013 |
| JP | 2013114972 A | 6/2013 |
| JP | 2013175819 A | 9/2013 |
| WO | 2014140357 A1 | 9/2014 |

* cited by examiner

GIMBAL REMOTE CONTROLLER AND HANDHELD GIMBAL USING THE GIMBAL REMOTE CONTROLLER

CROSS-REFERENCE TO RELATED APPLICATION

This is a continuation application of International Application No. PCT/CN2015/070212, filed on Jan. 6, 2015, the entire contents of which are incorporated herein by reference.

TECHNICAL FIELD

The present disclosure generally relates to a remote controller, and in particular, to a gimbal remote controller for controlling a gimbal and a handheld gimbal using the gimbal remote controller.

BACKGROUND

When a handheld gimbal is used to acquire a good picture in photography or film shooting, a remote controller is usually used to control the posture of the gimbal. However, traditional remote controllers of a handheld gimbal is large, and needs several persons to cooperate for operation. For example, one person holds the gimbal, and another person uses the remote controller to control the gimbal. The operations are less convenient, and a photographer cannot complete the control over the gimbal in the process of shooting, which limits the effect of the picture taken.

Therefore, there is a need for a remote controller that allows a photographer or a videographer to simultaneously control a camera gimbal in the process of shooting.

SUMMARY

Embodiments of the present disclosure provide a gimbal remote controller, which has a compact structure and facilitates the control over a gimbal, and a handheld gimbal using the gimbal remote controller, which can solve the problem that the gimbal cannot be controlled during shooting by a single person.

In one aspect of the present disclosure, a gimbal remote controller, including: a press key; a pressure sensor disposed below the press key and configured to acquire an operation state of the press key; and a controller electrically connected to the pressure sensor; wherein when the press key is pressed, the pressure sensor transmits an acquired operation state of the press key to the controller, and the controller sends a corresponding gimbal control signal in accordance with the operation state of the press key.

In the gimbal remote controller consistent with embodiments of the present disclosure, the press key can be operated with one hand, and the size of the gimbal remote controller can be effectively reduced, so that the structure of the gimbal remote controller is more compact and makes it more convenient to fix the gimbal remote controller onto a gimbal, whereby facilitating the control over the gimbal remote controller of the gimbal and thus solves the problem that the gimbal cannot be controlled during shooting by a single person.

In some embodiments, the operation state includes at least one of the followings: a pressing direction of the press key, pressing duration of the press key, and a magnitude of pressure applied to the press key.

In some embodiments, the gimbal control signal is used for controlling at least one of the followings: a rotation state of a rotary shaft of a gimbal, an operation mode of the gimbal, a function selection of the gimbal, and user-defined parameter setting.

In some embodiments, the rotation state includes at least one of the followings: a direction of rotation, an angle of rotation, and a speed of rotation.

In some embodiments, a housing is further included, the press key is mounted on the housing, and the pressure sensor and the controller are disposed in the housing.

In some embodiments, a display screen for displaying prompt information of the gimbal control signal is further included, the housing includes a display window, and the display screen is mounted in the housing and is disposed corresponding to the display window.

In some embodiments, the controller is a control circuit board, and the display screen is disposed above the control circuit board.

In some embodiments, a fixing bracket is further included, the fixing bracket is fixed on the control circuit board, and the display screen is mounted on the fixing bracket.

In some embodiments, a protection cover for covering the display window is further included.

In some embodiments, an upper connecting member for bearing the press key and a lower connecting member fixedly connected to the upper connecting member are further included, the housing includes a key hole, and at least one of the upper connecting member and the lower connecting member partially passes through the key hole, allowing the press key to be removably disposed on a surface of the housing.

In some embodiments, a pressure-sensitive rubber pad is further included, the lower connecting member is mounted on the pressure-sensitive rubber pad, and the pressure-sensitive rubber pad abuts against the pressure sensor.

In some embodiments, the pressure-sensitive rubber pad includes a base member and a plurality of supporting pillars, a plurality of arms extend around the peripheral edge of the base member, and each arm is fixedly connected to one of the supporting pillars, to cause the base member to be suspended on a support through the plurality of supporting pillars.

In some embodiments, the base member includes a mounting slot for mounting the lower connecting member.

In some embodiments, a power key is further included, and the power key is mounted on the housing.

In some embodiments, the housing includes a power key hole, and the power key is mounted in the power key hole.

In some embodiments, a press key cover is further included, the housing includes an accommodating recess for receiving the press key cover, the power key partially passes through the press key cover, and the power key hole is disposed at the bottom of the accommodating recess.

In some embodiments, a USB interface in communication with the controller is further included, the housing includes a port, and the USB interface is mounted in the housing and is disposed corresponding to the port.

In some embodiments, a USB protection cover for covering the USB interface is further included, and the USB protection cover is flexibly connected to the housing.

In some embodiments, the housing includes a receiving recess, the port is disposed at the bottom of the receiving recess, the bottom of the receiving recess includes a fixing hole, and the USB protection cover includes a plate body and a connecting pillar extending out from one side of the plate body and embedded into the fixing hole.

In some embodiments, the edge of the plate body includes a snap-fitting part, and a side wall of the receiving recess includes a mating part that engages with the snap-fitting part.

In some embodiments, a connecting mechanism that fixes the housing onto a gimbal body is further included.

In some embodiments, the connecting mechanism includes: an adaptor detachably connected to the housing; a clamping member removably connected to the adaptor, the clamping member and the adaptor together forming a clamping part; and a locking member for locking the adaptor and the clamping member.

In some embodiments, the adaptor includes an elastic clamp, and the housing is snapped fit with the elastic clamp to be fixed onto the adaptor.

In some embodiments, the adaptor includes a first arc-shaped concave portion, the clamping member includes a second arc-shaped concave portion, and the second arc-shaped concave portion and the first arc-shaped concave portion are disposed in a corresponding manner and are connected together to form the clamping part.

In some embodiments, one end of the clamping member is rotatably connected to the adaptor, and the other end is detachably connected to the adaptor through the locking member.

In some embodiments, an end portion of the clamping member includes a locking channel, the locking member includes a screw and a nut, one end of the screw is rotatably connected to the adaptor, the other end is received in the locking channel, and the nut captures the screw and abuts against an outer side of the locking channel, to prevent the screw from falling out of the locking channel.

In some embodiments, an outer side of the nut includes an operation handle, and the operation handle may be used to drive the nut to rotate.

In some embodiments, an antenna for wirelessly transmitting the gimbal control signal and electrically connected to the controller is further included.

At the same time, the present disclosure further provides a handheld gimbal using the gimbal remote controller.

A handheld gimbal, including: a gimbal body having a handle; and the gimbal remote controller described above, which is fixed onto the gimbal body and is disposed near the handle.

In some embodiments, the sensor is a pressure sensor, the press key may be controlled by pressing the press key, and the operation state includes at least one of the followings: a pressing direction of the press key, pressing duration of the press key, and a magnitude of pressure applied to the press key.

In some embodiments, the gimbal control signal is used for controlling at least one of the followings: a rotation state of a rotary shaft of a gimbal, an operation mode of the gimbal, a function selection of the gimbal, and user-defined parameter setting.

In some embodiments, the rotation state includes at least one of the followings: a direction of rotation, an angle of rotation, and a speed of rotation.

In some embodiments, a housing is further included, the press key is mounted on the housing, and the pressure sensor and the controller are disposed in the housing.

In some embodiments, a display screen for displaying prompt information of the gimbal control signal is further included, the housing includes a display window, and the display screen is mounted in the housing and is disposed corresponding to the display window.

In some embodiments, the controller is a control circuit board, and the display screen is disposed above the control circuit board.

In some embodiments, a fixing bracket is further included, the fixing bracket is fixed on the control circuit board, and the display screen is mounted on the fixing bracket.

In some embodiments, a protection cover for covering the display window is further included.

In some embodiments, an upper connecting member for bearing the press key and a lower connecting member fixedly connected to the upper connecting member are further included, the housing includes a key hole, and at least one of the upper connecting member and the lower connecting member partially passes through the key hole, allowing the press key to be movably disposed on a surface of the housing.

In some embodiments, a pressure-sensitive rubber pad is further included, the lower connecting member is mounted on the pressure-sensitive rubber pad, and the pressure-sensitive rubber pad abuts against the pressure sensor.

In some embodiments, the pressure-sensitive rubber pad includes a base member and a plurality of supporting pillars, a plurality of arms extend around the peripheral edge of the base member, and each arm is fixedly connected to one of the supporting pillars, allowing the base member to be suspended on a support structure through the plurality of supporting pillars.

In some embodiments, the base member includes a mounting slot for mounting the lower connecting member.

In some embodiments, a power key is further included, and the power key is mounted on the housing.

In some embodiments, the housing includes a power key hole, and the power key is mounted in the power key hole.

In some embodiments, a press key cover is further included, the housing includes an accommodating recess for receiving the press key cover, the power key partially passes through the press key cover, and the power key hole is disposed at the bottom of the accommodating recess.

In some embodiments, a USB interface in communication with the controller is further included, the housing includes a port, and the USB interface is mounted in the housing and is disposed corresponding to the port.

In some embodiments, a USB protection cover for covering the USB interface is further included, and the USB protection cover is flexibly connected to the housing.

In some embodiments, the housing includes a receiving recess, the port is disposed at the bottom of the receiving recess, the bottom of the receiving recess includes a fixing hole, and the USB protection cover includes a plate body and a connecting pillar extending out from one side of the plate body and embedded into the fixing hole.

In some embodiments, the edge of the plate body includes a snap-fitting part, and a side wall of the receiving recess includes a mating part that engages with the snap-fitting part.

In some embodiments, a connecting mechanism that fixes the housing onto a gimbal body is further included.

In some embodiments, the connecting mechanism includes: an adaptor detachably connected to the housing; a clamping member removably connected to the adaptor, the clamping member and the adaptor together form a clamping part; and a locking member for locking the adaptor and the clamping member together.

In some embodiments, the adaptor includes an elastic clamp, and the housing is snapped fit with the elastic clamp to be fixed onto the adaptor.

In some embodiments, the adaptor includes a first arc-shaped concave portion, the clamping member includes a second arc-shaped concave portion, and the second arc-shaped concave portion and the first arc-shaped concave portion are disposed in a corresponding manner and are connected together to form the clamping part.

In some embodiments, one end of the clamping member is rotatably connected to the adaptor, and the other end is detachably connected to the adaptor through the locking member.

In some embodiments, an end portion of the clamping member includes a locking channel, the locking member includes a screw and a nut, one end of the screw is rotatably connected to the adaptor, the other end is received in the locking channel, and the nut captures the screw and abuts against an outer side of the locking channel, to prevent the screw from falling out of the locking channel.

In some embodiments, an outer side of the nut includes an operation handle, and the operation handle may be used drive the nut to rotate.

In some embodiments, an antenna for wirelessly transmitting the gimbal control signal and electrically connected to the controller is further included.

DETAILED DESCRIPTION OF THE EMBODIMENTS

Figure 1:
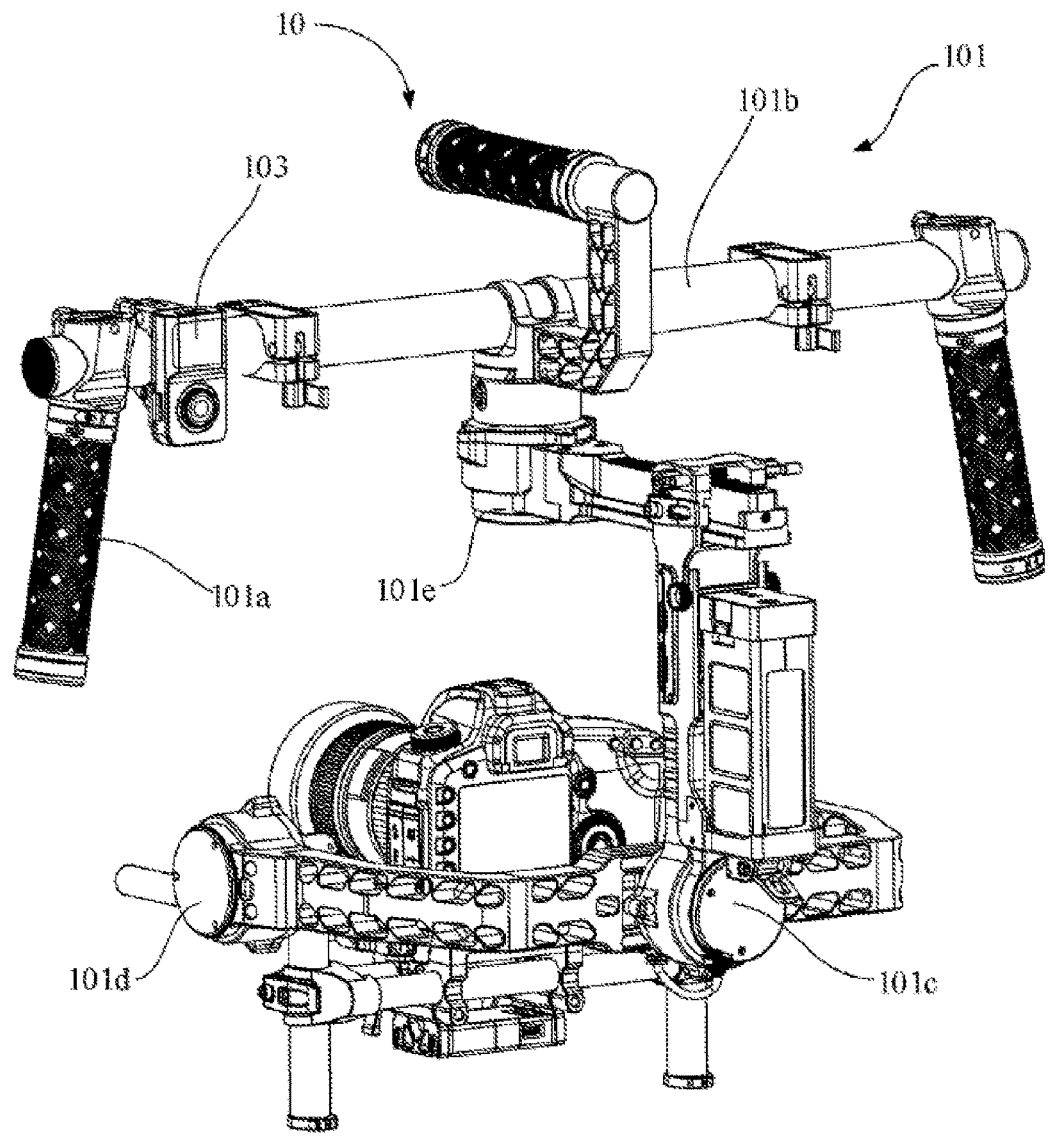
FIG. 1 is a perspective view of an exemplary handheld gimbal, in accordance with embodiments of the present disclosure.

Technical solutions of the present disclosure will be described with reference to the drawings. It will be appreciated that embodiments as described in the disclosure are a part rather than all of the embodiments of the present disclosure. Other embodiments, which are conceived by those having ordinary skills in the art on the basis of the disclosed embodiments without inventive efforts, should fall within the scope of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present disclosure do not represent all implementations consistent with the disclosure. Instead, they are merely examples of systems and methods consistent with aspects related to the invention as recited in the appended claims.

As used herein, when a first assembly is referred to as "fixed to" a second assembly, it is intended that the first assembly may be directly attached to the second assembly or may be indirectly attached to the second assembly via another assembly. When a first assembly is referred to as "connecting" to a second assembly, it is intended that the first assembly may be directly connected to the second assembly or may be indirectly connected to the second assembly via a third assembly between them. The terms "perpendicular," "horizontal," "left," "right," and similar expressions used herein are merely intended for description.

Unless otherwise defined, all the technical and scientific terms used herein have the same or similar meanings as generally understood by a person skilled in the technical field of the present disclosure. As described herein, the terms used in the specification of the present disclosure are intended to describe exemplary embodiments, instead of limiting the present disclosure. The term "and/or" used herein includes any suitable combination of one or more related items listed.

In one aspect of the present disclosure, a handheld gimbal is provided. The handheld gimbal includes a body and a gimbal remote controller. The gimbal remote controller is mounted on the body of the gimbal. For example, the gimbal remote controller is mounted on a handle of the handheld gimbal.

The gimbal remote controller includes a press key, a pressure sensor, and a controller. The pressure sensor is configured to acquire an operation state of the press key. The controller is configured to send a corresponding gimbal control signal in accordance with the operation state of the press key.

In some embodiments, the operation state may be detected in a variety of forms. For example, the operation state may be a pressing direction of the press key, pressing duration of the press key, a magnitude of pressure applied to the press key, etc.

In some embodiments, the gimbal control signal is used for controlling at least one of the followings: a rotation state of a rotary shaft of a gimbal, an operation mode of the gimbal, a function selection of the gimbal, and user-defined parameter setting.

For example, the rotary shaft may have at least one of a roll axis, a pitch or tilt axis, and a pan or translation axis. The rotation state may refer to a direction of rotation, an angle of rotation, a speed of rotation, etc.

The operation mode of the gimbal includes at least one of the followings: track mode (Smooth Track) off, track mode, and an automatic centering mode.

The function selection of the gimbal includes at least one of the followings: selecting a speed of rotation of the gimbal in track mode, and activating a switch that turns off a motor. For example, the speed of rotation of the gimbal in track mode may be selected among three gears, e.g., fast, normal, and slow.

Embodiments of the present disclosure are described below in detail with reference to the accompanying drawings. Those of ordinary skill in the art in view of the disclosure herein will recognize that features of one or more of the embodiments described in the present disclosure may be selectively combined or alternatively used.

FIG. 1 is a perspective view of an exemplary handheld, a gimbal 10, in accordance with embodiments of the present disclosure. Gimbal 10 includes a gimbal body 101 and a gimbal remote controller 103. The gimbal remote controller 103 is mounted on the gimbal body 101. For example, as illustrated in FIG. 1, a handheld gimbal is taken as an example of the gimbal 10 for description.

The gimbal body 101 includes a handle 101a, a beam 101b, a roll axis rotatory shaft 101c, a tilt axis rotatory shaft 101d, and a pan axis rotatory shaft 101e. There may be a plurality of handles 101a, and the handles 101a may be fixedly connected to the beam 101b. The roll axis rotatory shaft 101c, the tilt axis rotatory shaft 101d, and the pan axis rotatory shaft 101e are connected to each other, and one of them is connected to the beam 101b.

The gimbal remote controller 103 is attached to the gimbal body 101, and is disposed near the handle 101a. For example, as illustrated in FIG. 1, the gimbal remote controller 103 is mounted to the beam 101b of the gimbal body 101, and disposed near the handle 101a.

Figure 4:
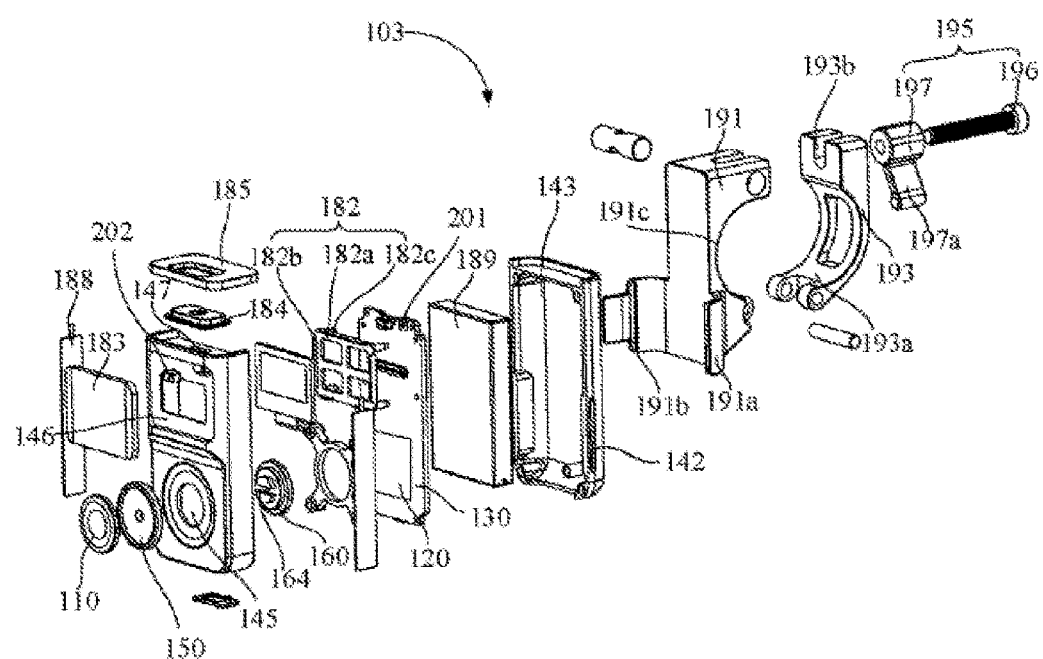
FIG. 4 is a perspective exploded view of the gimbal remote controller of FIG. 2.
Figure 5:
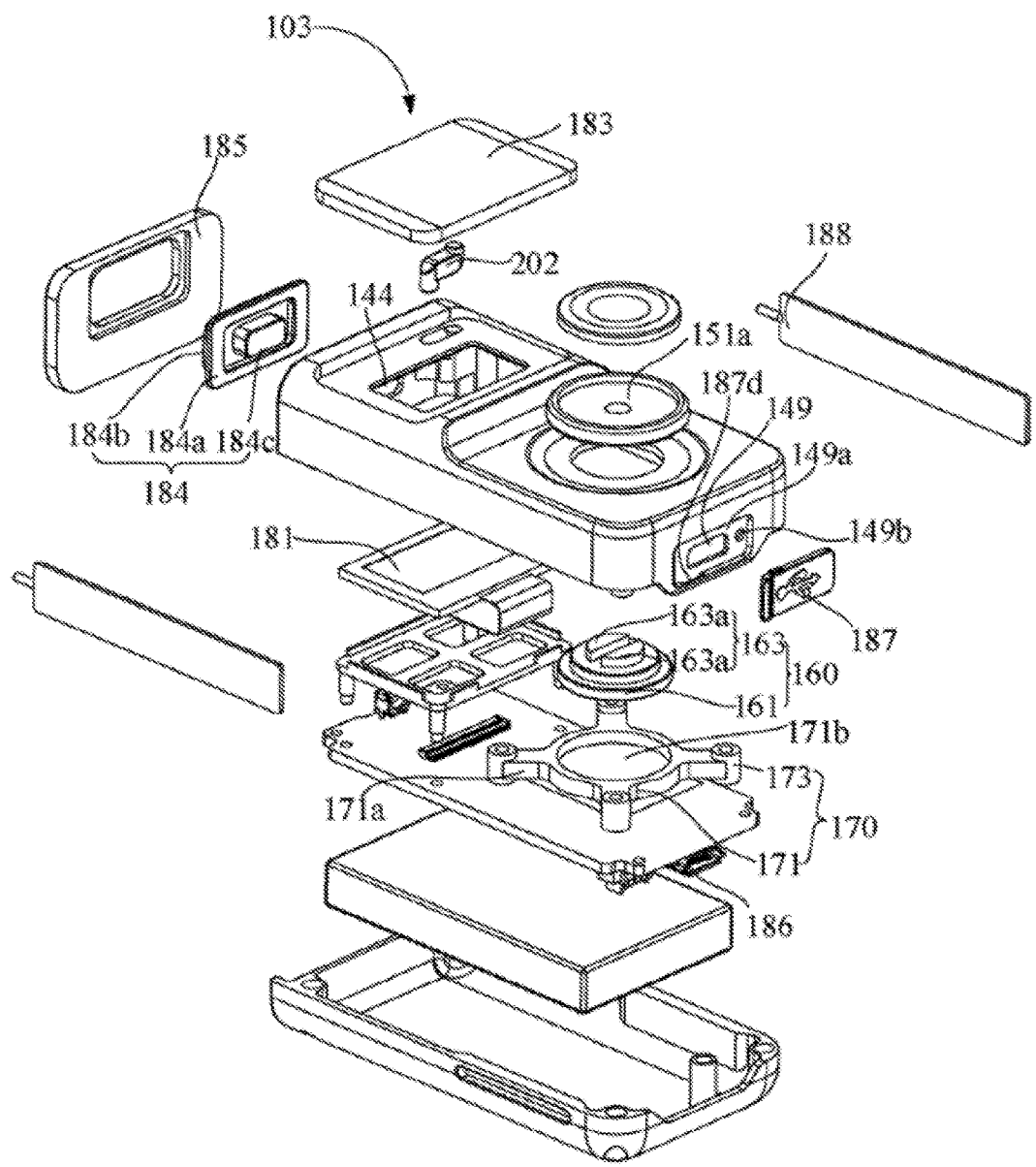
FIG. 5 is another perspective exploded view of the gimbal remote controller of FIG. 2.
Figure 6:
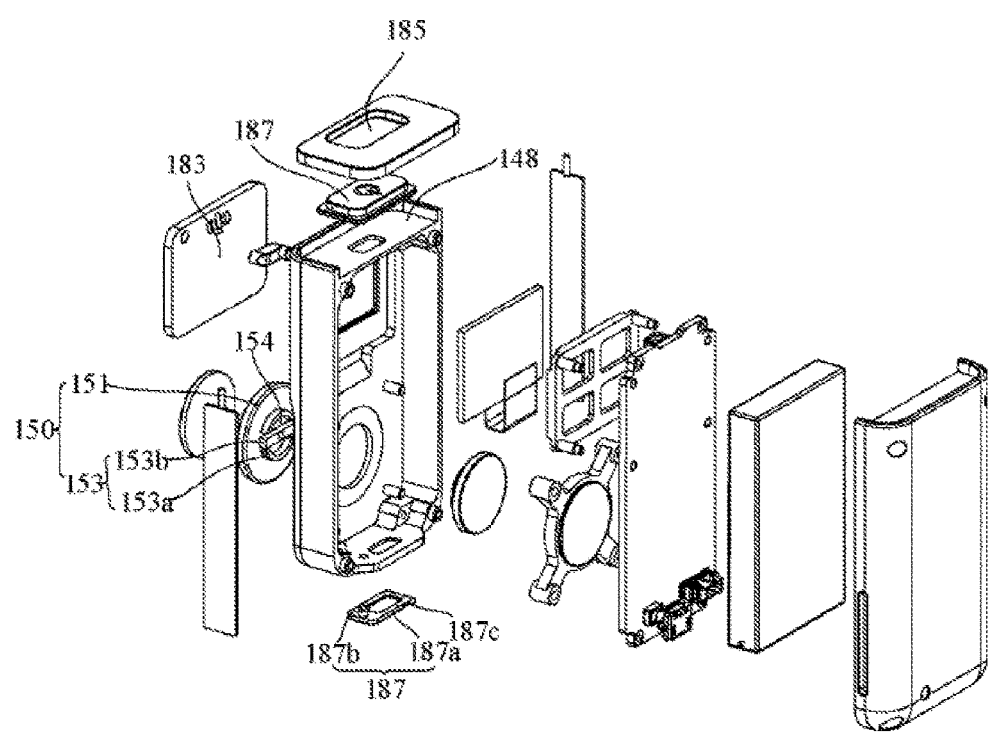
FIG. 6 is another perspective exploded view of the gimbal remote controller shown in FIG. 2.

FIGS. 4-6 are various perspective exploded views of the gimbal remote controller 103. As shown in FIGS. 4-6, the gimbal remote controller 103 includes a press key 110, a pressure sensor 120, and a controller 130. The press key 110 is configured to receive user input of a gimbal control signal. The pressure sensor 120 is configured to acquire an operation state of the press key 110. The controller 130 is configured to send a corresponding gimbal control signal in accordance with the operation state of the press key 110.

The press key 110 is configured to trigger the pressure sensor 120, and the pressure sensor 120 acquires a user instruction by sensing the operation state of the press key 110.

The press key 110 may be a one-way operation press key, that is, the press key 110 can be pressed towards one direction. Alternatively, the press key 110 may be a multi-way operation press key, that is, the press key 110 can be pressed towards multiple directions. For example, as illustrated in FIGS. 4-6, the press key 110 is a multi-way operation press key. The press key 110 may be pressed towards eight different directions, e.g., upper, lower, left, right, upper left, lower left, upper right, and lower right.

The configuration of the press key 110 may be designed based on various demands. For example, as shown in FIG. 3, the gimbal remote controller 103 further includes a housing 140, and the press key 110 is mounted on the housing 140.

Figure 3:
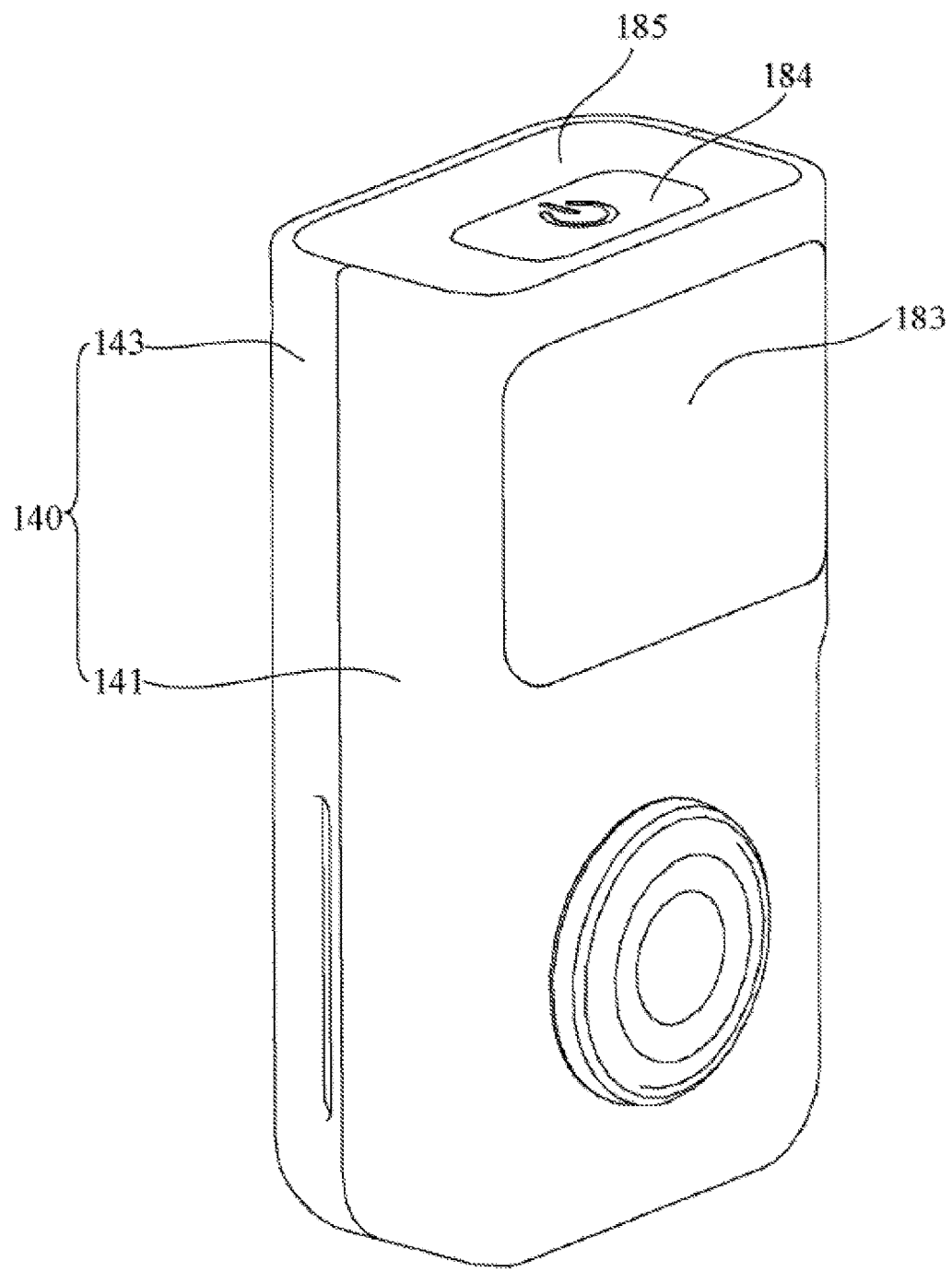
FIG. 3 is a partial perspective view of an exemplary gimbal remote controller of the handheld gimbal of FIG. 1.

As shown in FIG. 3, the housing 140 includes a rectangular upper cover 141 and a rectangular lower cover 143. The upper cover 141 and the lower cover 143 are detachably connected together through a threaded fastener, a snap, or other suitable structures, and jointly form a receiving cavity. The press key 110 is mounted on a surface of the upper cover 141.

The manner for mounting the press key 110 may be designed based on various demands. For example, as illustrated in FIGS. 4 and 6, the gimbal remote controller 103 further includes an upper connecting member 150 for bearing the press key 110 and a lower connecting member 160 fixedly connected to the upper connecting member 150. The housing 140 has a key hole 145, and at least one of the upper connecting member 150 and the lower connecting member 160 partially passes through the key hole 145, thereby allowing the press key 110 to be movably disposed on the surface of the housing 140.

As shown in FIG. 6, the upper connecting member 150 includes an upper body 151 and an upper boss 153 disposed on one side of the upper body 151. The upper body 151 is circular, and its size is greater than that of the key hole 145 of the housing 140, thereby blocking the upper body 151 from an outer side of the key hole 145. There are a plurality of upper bosses 153, including two arc-shaped bosses 153a and an "I" shaped boss 153b. The two arc-shaped bosses 153a are opposite to and spaced apart from each other, and the "I" shaped boss 153b is located between the two arc-shaped bosses 153a, which forms a fan-shaped recess 154 with the two arc-shaped bosses 153a respectively.

As shown in FIG. 5, a surface of the upper body 151 of the upper connecting member 150 that is opposite to the upper boss 153 includes a key slot 151a, and the press key 110 is mounted in the key slot 151a of the upper connecting member 150.

As shown in FIGS. 4 and 5, the lower connecting member 160 includes a lower body 161 and a lower boss 163 disposed on one side of the lower body 161. The lower body 161 is circular, and its size is greater than that of the key hole 145 of the housing 140, thereby blocking it from an inner side of the key hole 145. There are a plurality of lower bosses 163, including two fan-shaped bosses 163a. The two fan-shaped bosses 163a are opposite to and spaced apart from each other, forming an "I" shaped recess 164 therebetween.

The lower bosses 163 of the lower connecting member 160 and the upper bosses 153 of the upper connecting member 150 pass through the key hole 145 of the housing 140. For example, the "I" shaped boss 153b of the upper connecting member 150 is received in the "I" shaped recess 164 of the lower connecting member 160, and the two fan-shaped bosses 163a of the lower connecting member 160 are respectively received in the two fan-shaped recesses 154 of the upper connecting member 150.

The pressure sensor 120 is disposed below the press key 110, and is configured to sense an operation state of the press key 110. The operation state may be a pressing direction of the press key 110, pressing duration of the press key 110, a magnitude applied to the press key 110, etc.

As illustrated in FIGS. 4 and 5, the pressure sensor 120 is received in the housing 140. The gimbal remote controller 103 further includes a pressure-sensitive rubber pad 170. The lower connecting member 160 is mounted on the pressure-sensitive rubber pad 170, and the pressure-sensitive rubber pad 170 abuts against the pressure sensor 120.

The specific structure of the pressure-sensitive rubber pad 170 may be designed based on various demands. For example, as shown in FIG. 5, the pressure-sensitive rubber pad 170 includes a base member 171 and a plurality of supporting pillars 173. A plurality of arms 171a extend from the peripheral edge of the base member 171, and each arm 171a is fixedly connected to one of the supporting pillars 173, allowing the base member 171 to be suspended on a support structure through the plurality of supporting pillars 173. For example, the base member 171 is suspended on a control circuit board through the plurality of supporting pillars 173.

Further, the base member 171 includes a mounting slot 171b for mounting the lower connecting member 160, which facilitates positioning of the lower connecting member 160, and further positioning of the press key 110.

Further, the base member 171 and the arms 171a of the pressure-sensitive rubber pad 170 may be flat structures. The arms 171a are disposed perpendicular to axial directions of the supporting pillars 173.

Further, the thicknesses of the base member 171 and the arms 171a of the pressure-sensitive rubber pad 170 are less than the height of the supporting pillars 173. The arms 171a are fixedly connected to middle portions of the supporting pillars 173.

As shown in FIG. 4, the controller 130 is electrically connected to the pressure sensor 120, and sends a corresponding gimbal control signal for controlling the gimbal 10 in accordance with received user instruction. For example, when the press key 110 is pressed, the pressure sensor 120 transmits the acquired operation state of the press key 110 to the controller 130, and the controller 130 sends a corresponding gimbal control signal in accordance with the operation state of the press key 110.

In some embodiments, the gimbal control signal is used for controlling at least one of the followings: a rotation state of a rotary shaft of the gimbal 10, an operation mode of the gimbal 10, a function selection of the gimbal 10, and user-defined parameter setting.

The rotary shaft may be at least one of a roll axis rotatory shaft 101c, a tilt axis rotatory shaft 101d, and a pan axis rotatory shaft 101e. The rotation state may be a direction of rotation, an angle of rotation, a speed of rotation, etc.

The operation mode of the gimbal 10 includes at least one of the followings: track mode (Smooth Track) off, track mode, and an automatic centering mode.

The function selection of the gimbal 10 includes at least one of the followings: selecting a speed of rotation of the gimbal 10 in the track mode, and activating a switch that closes a motor. For example, the speed of rotation of the gimbal 10 in the track mode selected may be selected among three gears, e.g., fast, normal, and slow.

As shown in FIG. 5, the gimbal remote controller 103 further includes a display screen 181 for displaying prompt information of the gimbal control signal. The housing 140 may include a display window 144. The display screen 181 is mounted in the housing 140 and is disposed corresponding to the display window 144. For example, the display screen 181 is an OLED display screen.

The controller 130 may be a control circuit board, and the display screen 181 is disposed above the control circuit board. For example, as illustrated in FIGS. 4 and 5, the display screen 181 and the pressure sensor 120 are both disposed on the same side of the control circuit board and are respectively located on two ends of the control circuit board.

As shown in FIG. 4, the gimbal remote controller 103 further includes a fixing bracket 182. The fixing bracket 182 is fixed on the control circuit board, and the display screen 181 is mounted on the fixing bracket 182.

The specific structure of the fixing bracket 182 may be designed based on various demands. For example, as illustrated in FIG. 4, the fixing bracket 182 includes a carrying plate 182a, at least one positioning boss 182b, and at least one fixing pillar 182c. The middle portion of the carrying plate 182a includes a plurality of hollowed portions. The positioning boss 182b is disposed on a peripheral edge of one surface of the carrying plate 182a to abut against the edge of the display screen 181. The fixing pillar 182c is disposed at a corner of the other surface of the carrying plate 182a, and the control circuit board includes a corresponding fixing hole for receiving the insertion of the fixing pillar 182c.

As shown in FIGS. 4 and 5, the gimbal remote controller 103 further includes a protection cover 183 for covering the display window 144. For example, a surface of the housing 140 has a fixing recess 146 corresponding to the display window 144. The display window 144 penetrates the bottom of the fixing recess 146, and the protection cover 183 is mounted in the fixing recess 146.

As shown in FIGS. 4 and 5, the gimbal remote controller 103 further includes a power key 184. The power key 184 is mounted on the housing 140. For example, as illustrated in FIG. 4, the housing 140 has a power key hole 147, and the power key 184 is mounted in the power key hole 147.

As shown in FIGS. 4 and 5, the power key 184 includes a cover body 184a, a pressing boss 184b, and an abutment boss 184c. The pressing boss 184b and the abutment boss 184c are disposed on two opposite sides of the cover body 184a respectively, and the pressing boss 184b is disposed corresponding to the abutment boss 184c. The shape and size of the abutment boss 184c match the shape and size of the power key hole 147, allowing the abutment boss 184c to be slidable in the power key hole 147.

As shown in FIGS. 4 and 5, the gimbal remote controller 103 further includes a press key cover 185. The housing 140 includes an accommodating recess 148 configured to receive the press key cover 185. The power key 184 partially passes through the press key cover 185, and the power key hole 147 is disposed at the bottom of the accommodating recess 148.

As shown in FIG. 5, the gimbal remote controller 103 further includes a USB interface 186 in communication with the controller. The housing 140 includes a port 149, and the USB interface 186 is mounted in the housing 140 and disposed corresponding to the port 149. For example, the firmware of the gimbal remote controller 103 can be upgraded through the USB interface 186, or charging may be performed through the USB interface 186.

As shown in FIG. 5, the gimbal remote controller 103 further includes a USB protection cover 187 for covering the USB interface 186. The USB protection cover 187 is flexibly connected to the housing 140.

For example, as illustrated in FIG. 5, the housing 140 includes a receiving recess 149a. The port 149 is disposed at the bottom of the receiving recess 149a. The bottom of the receiving recess 149a includes a fixing hole 149b. As shown in FIG. 6, the USB protection cover 187 includes a plate body 187a and a connecting pillar 187b extending out from one side of the plate body 187a and embedded into the fixing hole 149b.

Further, the edge of the plate body 187a includes a snap-fitting part 187c, and a side wall of the receiving recess 149a includes a mating part 187d for engaging with the snap-fitting part 187c. For example, the snap-fitting part 187c is a hook disposed on the edge of the plate body 187a, and the mating part 187d is a slot disposed on a side wall of the receiving recess 149a.

Figure 2:
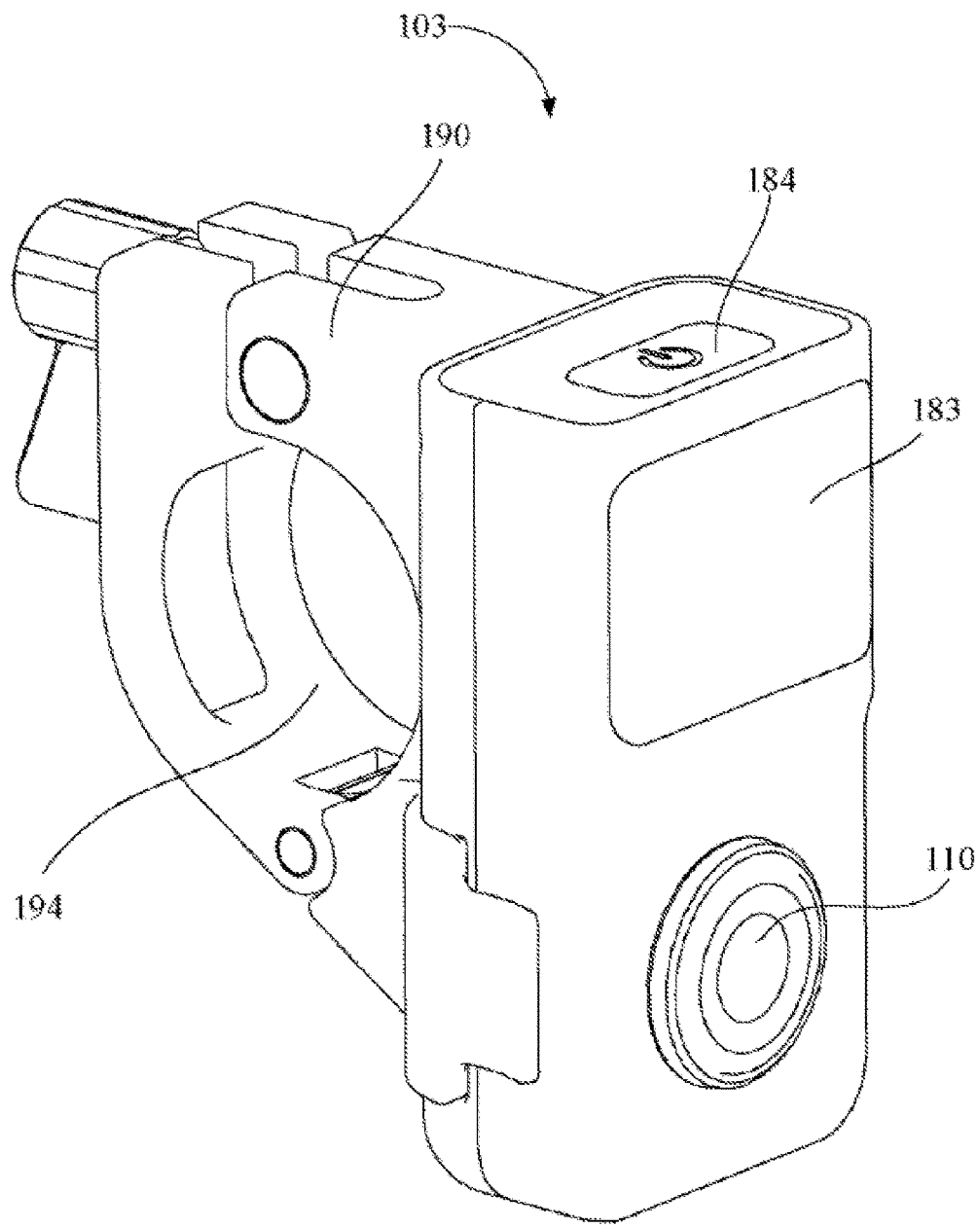
FIG. 2 is a perspective view of an exemplary gimbal remote controller of the handheld gimbal of FIG. 1.

As shown in FIG. 2, the gimbal remote controller 103 further includes a connecting mechanism 190 that fixes the housing 140 onto the gimbal body 101. For example, as illustrated in FIGS. 1-3, the housing 140 is fixed onto the beam 101b of the gimbal body 101 through the connecting mechanism 190, and the connecting mechanism 190 is disposed near the handle 101a of the gimbal body 101.

The specific structure of the connecting mechanism 190 may be designed based on various demands. For example, as illustrated in FIG. 4, the connecting mechanism 190 includes an adaptor 191, a clamping member 193, and a locking member 195.

The adaptor 191 is detachably connected to the housing 140. For example, as illustrated in FIG. 4, the adaptor 191 includes an elastic clamp 191a, and the housing 140 is snapped fit with the elastic clamp 191a to be fixed onto the adaptor 191. For example, the elastic clamp 191a may be a U-shaped clamp, and the housing 140 may press into the elastic clamp 191a, causing its opening to deform, so as to be clamped in the elastic clamp 191a.

Further, as shown in FIG. 4, inner sides of two arms of the elastic clamp 191a includes fitting bars 191b, and two opposite sides of the housing 140 have slots 142 that can engage with the fitting bars 191b.

The clamping member 193 is removably connected to the adaptor 191, and the clamping member 193 and the adaptor 191 together form a clamping part 194 (as shown in FIG. 2). For example, as illustrated in FIG. 4, the adaptor 191 has a first arc-shaped concave portion 191c, and the clamping member 193 has a second arc-shaped concave portion 193a. The second arc-shaped concave portion 193a and the first arc-shaped concave portion 191c are disposed in a corresponding manner and are connected together to form the clamping part 194. The connecting mechanism 190 is installed on the beam 101*b* of the gimbal body 101 through the clamping part 194.

The locking member 195 is configured to lock the adaptor 191 and the clamping member 193 together. For example, as illustrated in FIG. 4, a lower end of the clamping member 193 is rotatably connected to the adaptor 191, and an upper end is detachably connected to the adaptor 191 through the locking member 195.

As shown in FIG. 4, an upper end portion of the clamping member 193 includes a locking channel 193*b*. The locking member 195 includes a screw 196 and a nut 197. One end of the screw 196 may rotatably connect to the adaptor 191, and the other end is received in the locking channel 193*b*. The nut 197 captures the screw 196 and abuts against an outer side of the locking channel 193*b* to prevent the screw 196 from falling out of the locking channel 193*b*.

Further, an outer side of the nut 197 includes an operation handle 197*a*. The operation handle 197*a* may be used to drive the nut 197 to rotate, so as to make it more convenient to operate the nut 197.

As shown in FIG. 4, the gimbal remote controller 103 further includes an antenna 188 for wirelessly transmitting the gimbal control signal. The antenna 188 is electrically connected to the controller 130. The gimbal remote controller 103 can wirelessly transmit the gimbal control signal through the antenna 188.

For example, as illustrated in FIG. 4, the antenna 188 is a PCB antenna circuit board, and the gimbal remote controller 103 may include two of the PCB antenna circuit boards. The two PCB antenna circuit boards are respectively disposed on two opposite flanking sides of the control circuit board.

As shown in FIG. 4, the gimbal remote controller 103 further includes a rechargeable battery 189 that supplies power for the electronic elements described above. The rechargeable battery 189 is received in the housing 140, and is located below the controller 130.

Further, as shown in FIGS. 4 and 5, the gimbal remote controller 103 further includes a power indicator light 201 and a light guiding pillar 202. The power indicator light 201 is mounted on the controller 130, and the light guiding pillar 202 is mounted on the housing 140 and is disposed correspondingly to the power indicator light 201.

For example, the power indicator light 201 is an LED. The light guiding pillar 202 includes a transverse light guiding rod, an upper light guiding pillar, and a lower light guiding pillar. The upper light guiding pillar and the lower light guiding pillar are respectively vertically connected to two ends of the transverse light guiding rod and extend towards two opposite sides of the transverse light guiding rod. The lower light guiding pillar directs to the power indicator light 201, and the upper light guiding pillar is exposed outside of the housing 140. Light emitted by the power indicator light 201, after passing through a lower light guiding pillar, passes through the transverse light guiding rod to be transferred to the upper light guiding pillar, and finally is guided to the protection cover 183 on the housing 140 by the upper light guiding pillar.

As described herein, the pressure sensor 120 may be replaced with a rocker potentiometer or other suitable sensors. In such instances, controlling the press key 110 may be achieved by shifting the press key 110.

The described gimbal remote controller 103 uses a pressure sensor to sense an operation state of a press key, making it more convenient to operate the press key. The size of the gimbal remote controller can be effectively reduced, so that the structure of the gimbal remote controller 103 is compact and makes it more convenient to fix the gimbal remote controller 103 onto a gimbal, thereby facilitating the control over the gimbal remote controller, which advantageously solves the problem that the gimbal cannot be controlled as needed during shooting by a single person.

The above descriptions are merely embodiments of the present disclosure, and are not intended to limit the scope of the present disclosure. Any equivalent structure made by using contents of the specification and the drawings of the present disclosure, or directly or indirectly applied to other related technical fields, should be likewise included in the scope of the present disclosure.

The foregoing disclosure is merely illustrative of the embodiments of the disclosure but not intended to limit the scope of the disclosure. Any equivalent modifications to a structure or process flow, which are made without departing from the specification and the drawings of the disclosure, and a direct or indirect application in other relevant technical fields, shall also fall into the scope of the disclosure.

What is claimed is:

1. A gimbal remote controller, comprising:
a housing comprising a key hole;
a press key mounted on the housing;
an upper connecting member bearing the press key and a lower connecting member fixedly connected to the upper connecting member, at least one of the upper connecting member or the lower connecting member partially passing through the key hole;
a pressure sensor disposed below the press key and in the housing, the pressure sensor being configured to measure a parameter related to a pressing operation applied to the press key; and
a controller disposed in the housing and electrically coupled to the sensor, the controller being configured to send a gimbal control signal in accordance with the parameter related to the pressing operation applied the press key.

2. The gimbal remote controller of claim 1, wherein:
the parameter related to the pressing operation applied to the press key comprises at least one of a pressing direction of the press key, a pressing duration of the press key, or a magnitude of pressure applied to the press key.

3. The gimbal remote controller of claim 1, wherein the gimbal control signal is used for controlling at least one of a rotation state of a rotary shaft of a gimbal, an operation mode of the gimbal, a function selection of the gimbal, or a user-defined parameter setting.

4. The gimbal remote controller of claim 3, wherein the rotation state comprises at least one of a direction of rotation, an angle of rotation, or a speed of rotation.

5. The gimbal remote controller of claim 1, further comprising:
a display screen for displaying prompt information of the gimbal control signal,
wherein:
the housing comprises a display window, and
the display screen is mounted in the housing and disposed corresponding to the display window.

6. The gimbal remote controller of claim 5, wherein the controller includes a control circuit board, and the display screen is disposed above the control circuit board.

7. The gimbal remote controller of claim 6, further comprising:

a fixing bracket fixed on the control circuit board, the display screen being mounted on the fixing bracket.

8. The gimbal remote controller of claim 5, further comprising:
a protection cover covering the display window.

9. The gimbal remote controller of claim 1, further comprising:
a pressure-sensitive rubber pad abutting against the sensor, the lower connecting member being mounted on the pressure-sensitive rubber pad.

10. The gimbal remote controller of claim 9, wherein the pressure-sensitive rubber pad comprises a base member, a plurality of supporting pillars, and a plurality of arms extending around a peripheral edge of the base member, at least one of the arms being fixedly connected to one of the supporting pillars.

11. The gimbal remote controller of claim 10, wherein the base member comprises a mounting slot, the lower connecting member being mounted in the mounting slot.

12. The gimbal remote controller of claim 1, further comprising:
a power key mounted on the housing.

13. The gimbal remote controller of claim 12, wherein the housing comprises a power key hole, and the power key is mounted in the power key hole.

14. The gimbal remote controller of claim 13, further comprising:
a press key cover,
wherein:
the housing comprises an accommodating recess receiving the press key cover,
the power key partially passes through the press key cover, and
the power key hole is disposed at a bottom of the accommodating recess.

15. The gimbal remote controller of claim 1, further comprising:
a USB interface in communication with the controller, wherein:
the housing comprises a port, and
the USB interface is mounted in the housing and is disposed corresponding to the port.

16. The gimbal remote controller of claim 15, further comprising:
a USB protection cover covering the USB interface, the USB protection cover being flexibly connected to the housing.

17. The gimbal remote controller of claim 16, wherein:
the housing comprises a receiving recess,
the port is disposed at a bottom of the receiving recess,
the bottom of the receiving recess comprises a fixing hole, and
the USB protection cover comprises a plate body and a connecting pillar extending from one side of the plate body and embedded in the fixing hole.

18. The gimbal remote controller of claim 17, wherein an edge of the plate body comprises a snap-fitting part, and a side wall of the receiving recess comprises a mating part that engages with the snap-fitting part.

\* \* \* \* \*